(12) United States Patent
Kobayashi

(10) Patent No.: US 7,435,662 B2
(45) Date of Patent: Oct. 14, 2008

(54) METHOD FOR MANUFACTURING SOI WAFER

(75) Inventor: Makoto Kobayashi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 390 days.

(21) Appl. No.: 10/536,428

(22) PCT Filed: Nov. 13, 2003

(86) PCT No.: PCT/JP03/14442

§ 371 (c)(1),
(2), (4) Date: May 26, 2005

(87) PCT Pub. No.: WO2004/051715

PCT Pub. Date: Jun. 17, 2004

(65) Prior Publication Data

US 2006/0024915 A1    Feb. 2, 2006

(30) Foreign Application Priority Data

Nov. 29, 2002  (JP) .............................. 2002-348610

(51) Int. Cl.
*H01L 21/30* (2006.01)
*H01L 21/46* (2006.01)
(52) U.S. Cl. .............................. 438/455; 257/E21.568
(58) Field of Classification Search ................. 438/455; 257/E21.568
See application file for complete search history.

(56) References Cited

U.S. PATENT DOCUMENTS 6,534,380 B1 *  3/2003  Yamauchi et al. ........... 438/455

FOREIGN PATENT DOCUMENTS

| EP | 1 189 266 A1 | 3/2002 |
| JP | 05-090116 A1 | 4/1993 |
| JP | 2001-326197 A1 | 11/2001 |
| JP | 2001-328062 A1 | 11/2001 |
| JP | 2001-345435 A1 | 12/2001 |
| WO | WO-01/73831 A1 | 10/2001 |

OTHER PUBLICATIONS

PCT International Search Report for PCT/JP03/14442 mailed on Feb. 24, 2004.

* cited by examiner

*Primary Examiner*—Asok K Sarkar
(74) *Attorney, Agent, or Firm*—Rader, Fishman & Grauer PLLC

(57) ABSTRACT

The present invention provide a method for manufacturing an SOI wafer which suppresses voids from being generated in an SOI wafer, especially, in an outer peripheral portion thereof to achieve high productivity. According to the present invention, in a method for manufacturing an SOI wafer in which an insulating layer is formed on at least one of two wafers serving as starting wafers, and the wafer is bonded to the other wafer without an adhesive, a wafer having such an outer peripheral configuration that a configuration change width is 0.1 μm or less in a region of between 10 mm and 3 mm away from the outer periphery is used as the starting wafer.

6 Claims, 15 Drawing Sheets

(a)

(b)

METHOD FOR MANUFACTURING SOI WAFER

TECHNICAL FIELD

The present invention relates to a method for manufacturing a wafer and, more particularly, to a method for manufacturing an SOI (Silicon on Insulator) wafer constituted of an SOI layer, an insulating layer, and a support substrate which is obtained by an ion implantation delamination method or the like.

BACKGROUND ART

In recent years, an integration level in an integrated circuit has greatly increased, which has been accompanied by stricter required conditions imposed on a processing precision such as flatness or smoothness of a mirror-polished wafer surface. In addition, in order to achieve an integrated circuit higher in performance, reliability and product yield, not only a higher mechanical precision, but also better electric characteristics have been required. Especially, an SOI wafer, which is an ideal dielectric isolation substrate, has been used in applications to high frequency and high-speed devices mainly related to mobile communication equipment and medical equipment and further great increase in demand therefor is expected in the future.

An SOI wafer 50, as shown in FIG. 13, has a structure in which an SOI layer 52 (also referred to as a semiconductor layer or an active layer) for forming an element such as a single crystal silicon layer is formed on an insulating layer 54 (also referred to as a buried oxide (BOX) film layer or simply an oxide film layer) such as a silicon oxide film. The insulating layer 54 is formed on a support substrate 56 (also referred to as a substrate layer) and the SOI wafer 50 has a structure in which the insulating layer 54 and the SOI layer 52 are sequentially formed on the support substrate 56. In FIG. 13, reference numeral 60 designates an unbonded region, and reference numeral 62 designates a terrace, which will be described later.

As conventional methods for manufacturing an SOI wafer 50 having the SOI structure in which the SOI layer 52 and the support substrate 56 are made of, for example, silicon and the insulating layer 54 is made of, for example, a silicon oxide film, there are exemplified an SIMOX (Separation by implanted oxygen) method in which oxygen ions are implanted into a silicon single crystal at a high concentration and thereafter the single crystal is subjected to heat treatment at a high temperature to form an oxide film thereon; and a bonding method (an adhering method) in which two mirror-polished wafers are bonded with each other without the use of an adhesive, followed by processing one of the bonded wafers into a thin film.

Since the SIMOX method can controllably determine a film thickness of an active layer portion (an SOI layer) 52 to serve as a device active region by an acceleration voltage in oxygen ion implantation, there is an advantage that a thin active layer high in film thickness uniformity can be easily obtained, whereas there have remained many issues of reliability of a buried oxide (BOX) film (an insulating layer) 54, crystallinity in an active layer, and others.

On the other hand, a wafer bonding method is carried out in such a way that an oxide film (an insulating layer) 54 is formed on at least one of two single crystal silicon mirror-polished wafers, then both wafers are adhered with each other without using an adhesive, then the adhered wafers are subjected to heat treatment (usually at a temperature in the range of 1100° C. to 1200° C.) to strengthen bonding therebetween and thereafter one of the wafers is thinned into a thin film by grinding or wet etching, followed by mirror-polishing the surface of the thin film so as to obtain an SOI layer 52; which leads to advantages that reliability of the buried oxide (BOX) film (an insulating layer) 54 is high and crystallinity of the SOI layer is also good. However, the thus adhered SOI wafer 50 is subjected to mechanical processing such as grinding or polishing into a thin film, and hence the obtained SOI layer 52 have limitations in its film thickness and uniformity.

As a method for manufacturing an SOI wafer 50, it has very recently started to pay attention to a method for manufacturing an SOI wafer by bonding and delaminating an ion implanted wafer. This method is also referred to as an ion implantation delamination method, which is such a technique that two silicon wafers are provided to be ready for use; an oxide film (an insulating layer) is formed on at least one silicon wafer; hydrogen ions or rare gas ions are implanted onto an upper surface of the one silicon wafer; a micro-bubble layer (an enclosed layer) is formed in the interior of the one wafer, the surface onto which the ions are implanted is contacted and adhered with the other silicon wafer through the oxide film interposed therebetween; thereafter by applying heat treatment to the adhered wafers, a part of the one wafer is delaminated with the micro-bubble layer as a cleavage plane for the rest of the one wafer to become a thin film; and heat treatment is further applied to the rest of the adhered wafers to strongly bond the wafers, thereby an SOI wafer being obtained (see JP-A No. 5-211128). According to this method, the cleavage plane is a good mirror-polished surface and the SOI wafer 50 having high uniformity of film thickness of the SOI layer 52 can be obtained with relative ease.

In FIG. 14, further detailed description will be given of the ion implantation delamination method showing one example of a set of main steps thereof. There are provided to be ready for use two starting wafers, that is, a base wafer 56a serving as a support substrate 56 and a bond wafer 52a from which an SOI layer 52 is formed [FIG. 14(a), step 100]. As these wafers, for example, mirror-polished silicon single crystal wafers are used.

An oxide film 54a serving as a buried oxide (BOX) film (an insulating layer) at a later step is formed on a surface of the bond wafer 52a [FIG. 14(b), step 102]. This step is carried out as follows. For execution of this step, for example, thermal oxidation is applied on the bond wafer 52a of a silicon single crystal wafer to form a silicon oxide film on the bond wafer 52a. Incidentally, the formation of the oxide film may be performed on the surface of the base wafer 56a, not on the surface of the bond wafer 52a. In the illustrated embodiment, the exemplary case where the oxide film 54a is formed on the bond wafer 52a side will be explained.

Then, hydrogen ions are implanted into the bond wafer 52a through the oxide film 54a to form a micro-bubble layer (an enclosed layer) 58 [FIG. 14(c), step 104].

Thereafter, chemical cleaning may be carried out using an $H_2SO_4$—$H_2O_2$ mixed solution or the like (step 105). The $H_2SO_4$—$H_2O_2$ mixed solution has been known in a field of wet cleaning with an abbreviation of SPM (Sulfuric Acid-Hydrogen Peroxide Mixture) and is a cleaning solution for removal of organic contaminants.

Then, the bond wafer 52a in which the micro-bubble layer (the enclosed layer) 58 is formed is brought into close contact with the base wafer 56a at room temperature through the oxide film 54a on the surface of the bond wafer 52a onto which the ion implantation has been performed [FIG. 14(d), step 106].

Then, by applying heat treatment (delamination heat treatment) at a temperature of 500° C. or higher, a part of the bond wafer 52a is delaminated at the enclosed layer 58 and the rest of the bond wafer 52a stands in the form of a thin film [FIG. 14(e), step 108]. Next, by applying bonding heat treatment [FIG. 14(f), step 110], the bond wafer 52a in the form of the thin film and the base wafer 56a are strongly bonded with each other through the oxide film 54a interposed therebetween, whereby a wafer 50 having an SOI structure is manufactured.

The SOI wafer 50 manufactured using the adhering method has, at this stage, a sectional structure in which the insulating film (layer) 54 and the SOI layer 52 are separately and sequentially laminated on one main surface of the support substrate 56.

Also, as shown in FIG. 13, the insulating layer 54 and the SOI layer 52 are generally smaller in diameter than the support substrate 56 by a value of the order of several mm, usually about 3 mm (hereinafter, this portion may be referred to as an unbonded region).

In addition, another step may be adopted, in which a surface of the SOI layer 52 of the wafer having the SOI structure is modified and the thickness of the SOI layer 52 is controlled (FIG. 14, step 112). For example, since damage caused by hydrogen ion implantation remains on a surface (a delaminating plane) of the SOI layer 52 of the SOI wafer 50 having the obtained SOI structure, the damage layer is removed by applying polishing with a small polishing stock removal usually called touch polishing. In replacement of touch polishing, by performing heat treatment in an argon gas atmosphere, sacrifice oxidation treatment in which thermal oxidation and removal of an oxide film are conducted to reduce the film thickness of the SOI layer 52 or a combination thereof in a proper way, an SOI wafer 50 having a damage free thin film SOI layer 52 may be manufactured.

In fabrication of devices using the SOI wafer 50, there has been a problem of reducing a product yield of the devices. A cause of this problem is conceivably due to generation of a defect called a void (B) in the SOI layer 52 and an oxide film 54.

As a factor of void generation, for example, in the bonding method (the adhering method), organic matter or particles generated in the steps of manufacturing an SOI wafer may adversely affect the adhering interface to cause a decrease in yield. As another factor, there is conceivable the influence of defects or the like present in the base wafer or the bond wafer.

The problem of the organic matter or the particles can be solved to some extent by performing RCA cleaning or organic matter removing cleaning before wafers are adhered to each other. The RCA cleaning is a typical cleaning method in semiconductor processes using two cleaning liquids of two types, i.e., SC-1 (a liquid mixture of $NH_4OH/H_2O_2/H_2O$) and SC-2 (a liquid mixture of $HCl/H_2O_2/H_2O$) as bases. According to this cleaning method, impurities such as particles, organic matter, and metallic contaminants can be mainly removed. Organic matter removing cleaning called SPM cleaning may be employed.

As defects or the like present in the base wafer or the bond wafer, a defect called COP due to crystals, a defect due to processing, and the like become issues. These defects can be reduced to some extent by controlling manufacturing conditions. When using a wafer having fewer defects, generation of voids can also be reduced.

By manufacturing an SOI wafer under control of organic matter or particles generated when the wafers are adhered to each other and control of defects on the surfaces of the base wafer and the bond wafer, generation of voids can be reduced.

However, there were observed voids that are conceivably due to another new cause. More specifically, as shown in FIG. 15, there was observed a tendency of frequent generation at a specific position of the outer peripheral portion of the SOI wafer 50. FIG. 15 is a schematic view showing results of observation by a laser microscope with a confocal optical system on a part of the outer peripheral portion of the SOI wafer 50. There is called a terrace 62 the boundary between the unbonded region 60 (a portion where the support substrate 56 can be seen when the wafer is observed from the SOI layer 52 side) and the SOI layer 52. A circular void 70 is observed at a portion away from the terrace 62 by a predetermined distance. In particular, the void 70 was generated at a position away from the wafer outer periphery by about 5 mm (145 mm from the center when a wafer having a diameter of 300 mm is used) with reference to the outer peripheral portion of the base wafer. In FIG. 15, the part (b) shows the void 70 generated at a position away from the center by 145.1 mm, the part (c) shows the void 70 generated at a position away from the center by 145.4 mm, and the part (d) shows the void 70 generated at a position away from the center by 144.9 mm.

DISCLOSURE OF THE INVENTION

The present invention has been made in consideration of the above problems, and a main object thereof is to provide a method for manufacturing an SOI wafer that suppresses a void from being generated in an SOI wafer, especially, in an outer peripheral portion thereof to improve productivity.

The present inventor has earnestly investigated a cause of frequent generation of voids at a specific position of the outer peripheral portion of an SOI wafer. As a result, it has become clear that a configuration of a starting wafer and processing such as cleaning influence the generation of voids. In particular, it has been revealed that control of the configuration of the outer peripheral portion of the wafer can considerably reduce the generation of voids.

A first aspect of the method for manufacturing an SOI wafer according to the present invention comprises the steps of: forming an insulating layer on at least one wafer (a bond wafer) of two starting wafers; and adhering the one wafer to the other wafer (a base wafer) without an adhesive, wherein there is used as the starting wafer a wafer having an outer peripheral configuration with a configuration change width being 0.1 μm or less in a region of between 10 mm and 3 mm away from the outer periphery.

In this manner, the number of voids generated at a specific position in the wafer outer peripheral portion (the position away from a wafer outer periphery by about 5 mm) can be reduced. Conventionally, in order to reduce the width of the unbonded region, the configuration of the wafer outer periphery has also been studied. A wafer having small droop (sags) of the outer peripheral configuration is desirably used to reduce the unbonded region. It is surmised to some extent that a wafer flat to the outer periphery is preferred. However, it is difficult to actually manufacture such a flat wafer. Therefore, the peripheral sags have been improved, for example, by devising a chamfered configuration to reduce the unbondedgion. However, even though the configuration of the region has been improved, generation of the voids is observed regardless of the improvement. That is, even in a wafer having relatively small outer peripheral sags, voids are generated. It is apparent that the unbonded region of the outer periphery is not directly related to generation of the voids. When the cause of the above matter was studied, it has been found that the configuration of a region slightly inside from the outer periphery (the region of between 10 mm and 3 mm away from the outer periphery) specially affects the generation of the voids.

Although the cause is not clear, it is conceived that voids are easily generated at this position because air or the like is easily left depending on the configuration of the region when adhering the wafers, the adhesive force decreases by adhering the wafers to each other in this state, and the wafers are peeled from each other.

A second aspect of the method for manufacturing an SOI wafer according to the present invention comprises the steps of: forming an insulating layer on at least one wafer (a bond wafer) of two starting wafers; and adhering the one wafer to the other wafer (a base wafer) without an adhesive, wherein there is used as the starting wafer a wafer having an outer peripheral configuration with a slope being 0.002% or less at a position of 5 mm away from the outer periphery. With this configuration, generation of the voids can be similarly suppressed.

Furthermore, a third aspect of the method for manufacturing an SOI wafer according to the present invention comprises the steps of: forming an insulating layer on at least one wafer (a bond wafer) of two starting wafers; and adhering the one wafer to the other wafer (a base wafer) without an adhesive, wherein there is used as the starting wafer a wafer having an outer peripheral configuration with a configuration change width being 0.1 μm or less in a region of between 10 mm and 3 mm away from the outer periphery and a slope being 0.002% or less at a position of 5 mm away from the outer periphery.

As the method for manufacturing an SOI wafer in which the insulating layer is formed on at least one wafer (a bond wafer) of the two starting wafers, and the wafer is adhered to the other wafer (a base wafer) without an adhesive agent, there can be used the method comprising the steps of: forming an insulating layer on at least one wafer (a bond wafer) of two starting wafers; implanting hydrogen ions or rare gas ions through an upper surface of the one wafer (the bond wafer) to form a micro-bubble layer in the interior of the one wafer; thereafter bringing the surface of the one wafer through which the ions have been implanted into close contact with the other wafer (a base wafer) through the insulating layer interposed therebetween; then delaminating a part of the one wafer with the micro-bubble layer as a cleavage plane by applying heat treatment for the rest thereof to become a thin film; and bonding strongly the one wafer in the form of a thin film to the other wafer through the insulating layer interposed therebetween by applying further heat treatment.

As shown in FIG. 15, it has been found that voids are easily generated in the vicinity of a portion where a configuration sharply changes slightly inside the wafer outer peripheral portion. When wafers each having a gentle change of the configuration at the portion were adhered to each other, the generation of the voids was reduced.

It is conceived that voids are generated in the wafer outer peripheral portion in the delaminating step of an ion implantation delamination method or the like. The configuration of the starting wafer is very important to prevent the generation of the voids in the delaminating step.

A fourth aspect of the method for manufacturing an SOI wafer according to the present invention comprises: a wafer processing step having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein in the wafer processing step, each of the starting wafers is processed such that an outer peripheral configuration of the wafer has a configuration change width of 0.1 μm or less in a region of between 10 mm and 3 mm away from the outer periphery.

A fifth aspect of the method for manufacturing an SOI wafer according to the present invention comprises: a wafer processing step having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein, in the wafer processing step, each of the starting wafers is processed such that an outer peripheral configuration of the wafer has a slope of 0.002% or less at a position away from the outer periphery by 5 mm.

A sixth aspect of the method for manufacturing an SOI wafer according to the present invention comprises: a wafer processing having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein in the wafer processing step, each of the starting wafers is processed such that an outer peripheral configuration of the wafer has a configuration change width of 0.1 μm or less in a region of between 10 mm and 3 mm away from the outer periphery and a slope of 0.002% or less at a position of 5 mm away from the outer periphery. The wafer configuration is determined in the wafer processing step and the wafer having the configuration described above is processed by contriving, for example, a structure of a polishing head in the polishing step.

A seventh aspect of the method for manufacturing an SOI wafer according to the present invention comprises: a wafer processing step having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein the configuration of the wafer obtained in the wafer processing step is evaluated, wafers each having an outer peripheral configuration with a configuration change width of 0.1 μm or less in a region of between 10 mm and 3 mm away from the outer periphery are sorted, and an SOI wafer is manufactured using the sorted wafers.

An eighth aspect of a method for manufacturing an SOI wafer according to the present invention comprises: a wafer processing step having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein the configuration of the wafer obtained in the wafer processing step is evaluated, wafers each having an outer peripheral configuration with a slope of 0.002% or less at a position away from the outer periphery by 5 mm are sorted, and an SOI wafer is manufactured using the sorted wafers.

A ninth aspect of a method for manufacturing an SOI wafer according to the present invention comprises: a wafer processing step having a polishing step for mirror-polishing at least one main surface of at least one of two starting wafers; and an SOI wafer manufacturing step for adhering the two wafers including at least one mirror-polished wafer to each other to manufacture a wafer having an SOI structure, wherein the configuration of the wafer obtained in the wafer processing step is evaluated, wafers each having an outer peripheral configuration with a configuration change width of 0.1 μm or less in a region of between 10 mm and 3 mm away from the outer periphery and a slope of 0.002% or less at a position of 5 mm away from the outer periphery are sorted, and an SOI wafer is manufactured using the sorted wafers.

It is preferred that a wafer having the above characteristics can be perfectly manufactured in the above wafer processing step. However, since the wafer processing step includes various steps, the same configurations are not always obtained therein. In such a case, before manufacturing an SOI wafer, a wafer configuration is evaluated to sort and use a preferred wafer, so that generation of the voids can be reduced.

BEST MODE FOR CARRYING OUT THE INVENTION

Figure 1:
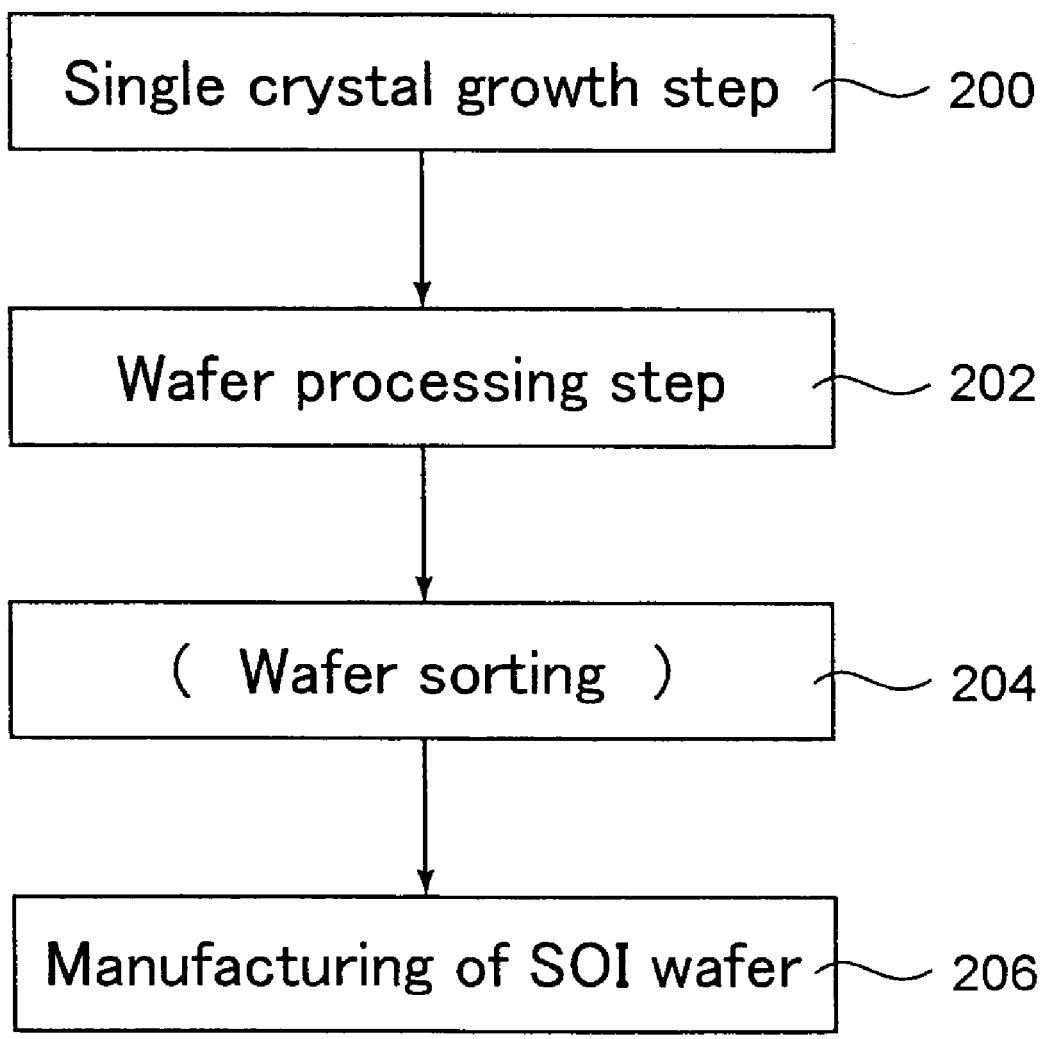
FIG. 1 is a schematic flow chart showing an example of an order of steps in a method for manufacturing an SOI wafer according to the present invention.

Embodiments of the present invention will be described below with reference to the accompanying drawings. It is needless to say that the embodiments shown in the drawings are exemplified, and various modifications can be effected without departing from the technical concept of the present invention.

Figure 14:
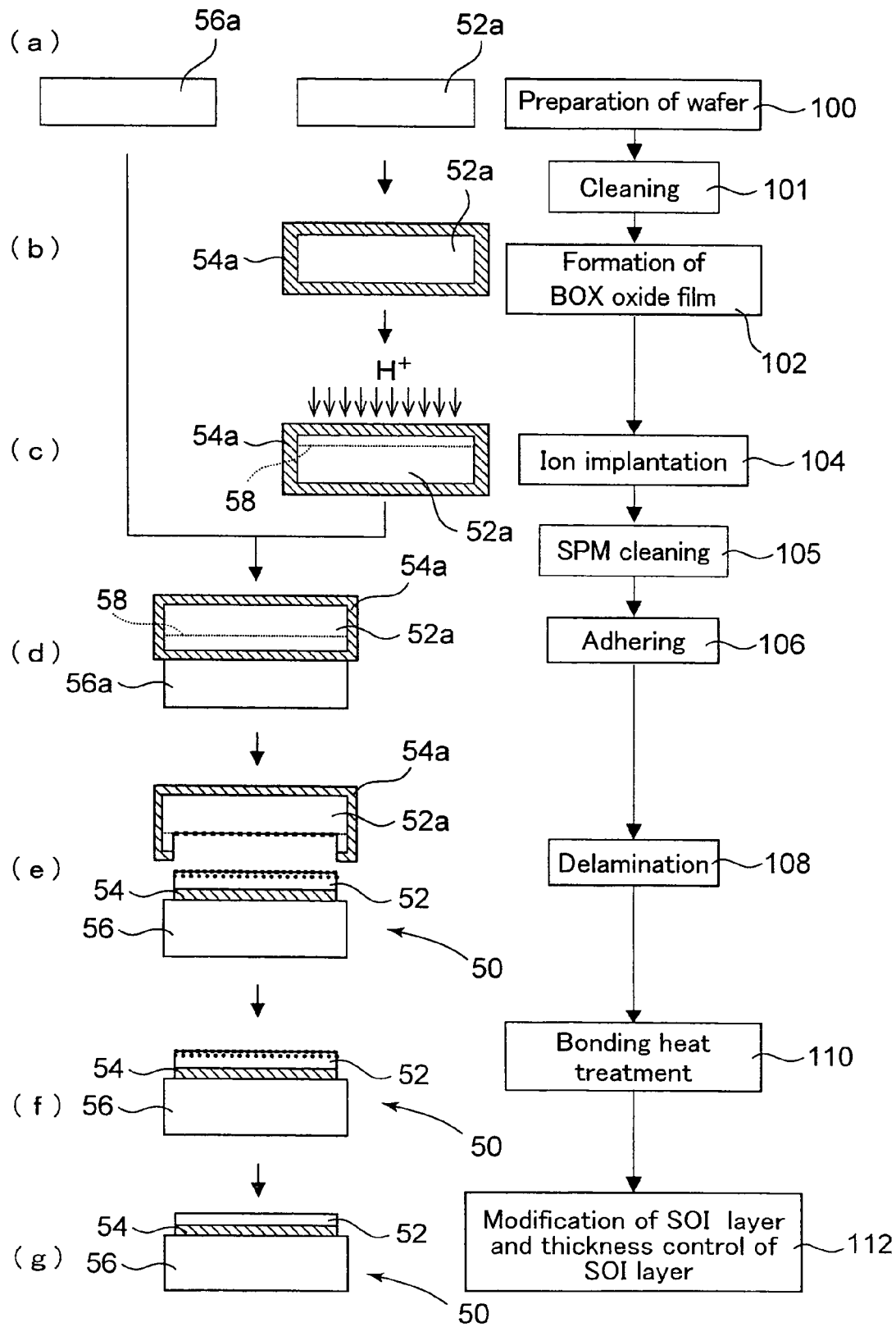
FIG. 14, consisting of FIGS. 14(*a*) to 14(*g*), is a flow chart showing an example of an order of steps in a conventional method for manufacturing an SOI wafer together with schematic views.

FIG. 1 is a schematic flow chart showing an example of an order of steps in a method for manufacturing an SOI wafer according to the present invention. FIG. 14 shows an example of a method for manufacturing an SOI wafer, wherein an SOI structure is formed by a conventional adhering method (an ion implantation delamination method) as described above. In the present invention, in the conventional method for manufacturing an SOI wafer shown in FIG. 14, adhering is performed such that the outer peripheral configurations of wafers to be used as starting materials of a bond wafer and a base wafer especially used in adhering are controlled.

First, a method for manufacturing a mirror-polished wafer to be used as a starting wafer will be described. The mirror-polished wafer, as shown in FIG. 1, is generally manufactured through a single crystal growth step (step 200) of producing a single crystal ingot using a Czochralski (CZ) method or the like and a wafer processing step (step 202) of slicing the single crystal ingot to form a wafer and processing at least one main surface of the wafer to form a mirror-polished wafer. In the wafer processing step (step 202), mirror polishing is performed such that a configuration change in a region ranging from 3 mm to 7 mm of the outer peripheral portion of the wafer is 0.1 mm or less.

Figure 2:
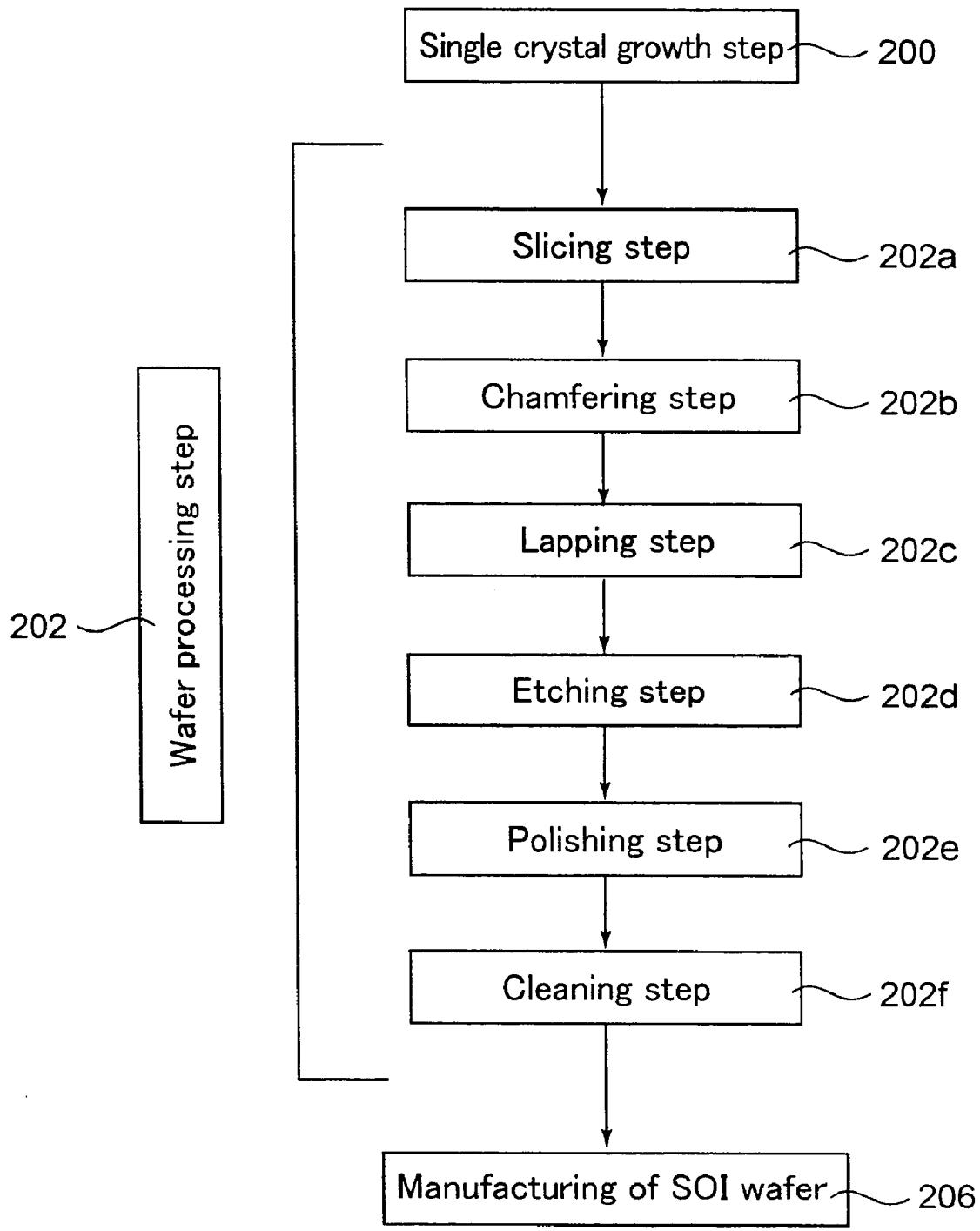
FIG. 2 is a flow chart showing another example of an order of steps in the method for manufacturing an SOI wafer according to the present invention.

More specifically, as shown in FIG. 2, the wafer processing step (step 202) includes: a slicing step (step 202*a*) of slicing a single crystal ingot to obtain a thin disk-like wafer; a chamfering step (step 202*b*) of chamfering a peripheral edge portion of the wafer obtained through the slicing step to prevent cracking or chipping of the wafer; a lapping step (step 202*c*) of flattening the chamfered wafer; an etching step (step 202*d*) of removing processing deformation remaining on the surface of the chamfered and lapped wafer; a polishing step (step 202*e*) of mirror-polishing the surface of the wafer; and a cleaning step (step 202*f*) of cleaning the polished wafer to remove a polishing agent or dust particles deposited thereon. The above-described wafer processing step (step 202) shows basic steps thereof, and sometimes other steps such as a heat treatment step and a surface grinding step may be added, or the same step may be divided into multiple sub-steps, or the step sequence may be changed. These steps are devised to manufacture a wafer having a high flatness level.

In the present invention, the configuration of the wafer manufactured in the wafer processing step, in particular, the configuration of the wafer outer peripheral portion is further exactly controlled; if necessary the wafer configuration is evaluated to sort only a suitable wafer (step 204); and an SOI wafer is manufactured using the sorted wafer as a starting wafer for the SOI wafer (step 206).

In order to manufacture the SOI wafer, as in the conventional steps shown in FIG. 14, a base wafer 56*a* serving as a support substrate 56 and a bond wafer 52*a* are prepared (FIG. 14(*a*)). Both the wafers are mirror-polished silicon single crystal wafers. As to the configuration of each of the wafers, there is used a wafer being free from a place where a configuration sharply changes in the wafer outer peripheral portion.

Figure 3:
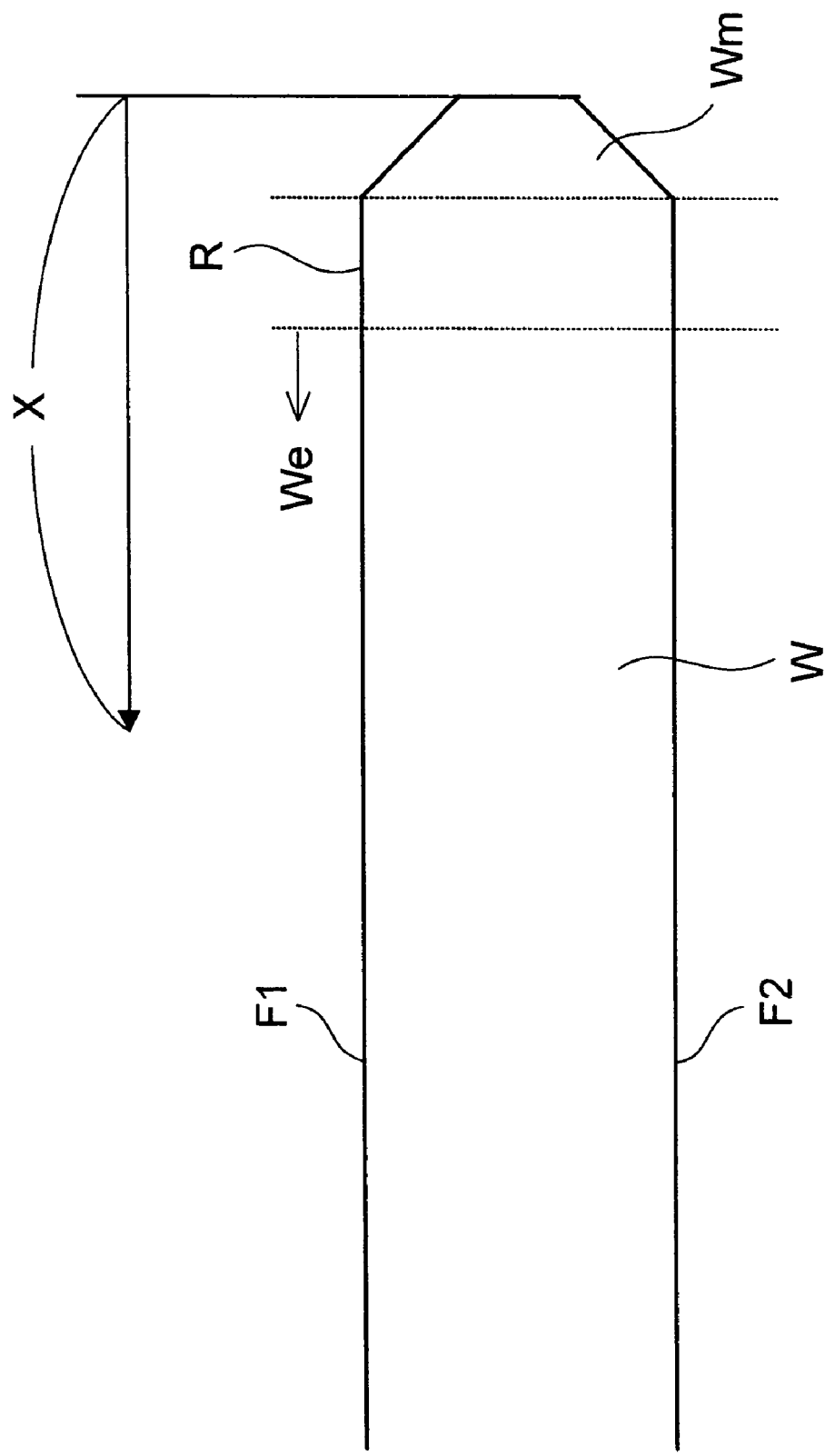
FIG. 3 is a schematic explanatory view showing an example of an outer peripheral configuration of a wafer.

A method for evaluating a wafer configuration will be described below. As shown in FIG. 3, the wafer outer peripheral portion is generally chamfered to prevent a wafer W from being cracked, and a chamfered portion Wm is formed. In general, the wafer configuration of the chamfered portion Wm is to be neglected in evaluation, and is not an object to be measured. The width of the chamfered portion Wm is about 500 μm (0.5 mm). Actual configuration evaluation is frequently performed for a region except a region extending from the chamfered portion Wm toward the main surface side by about 3 mm or 2 mm, and further by about 1 mm, i.e., a measurement exclusion region R. In FIG. 3, reference symbol F1 designates a wafer main surface (a front surface); reference symbol F2, a wafer main surface (a rear surface); reference symbol R, a measurement exclusion region; reference symbol We, a wafer effective region; reference symbol X, a distance of X mm when an outer peripheral portion is X mm.

The wafer configuration evaluating apparatus is not limited to a specific apparatus. However, for example, an apparatus shown in FIG. 4 can be used for the purpose. As the apparatus, there is preferably used an apparatus which scans a wafer surface at predetermined intervals and sequentially stores the measured configurations. The predetermined measurement interval on the wafer surface is preferably within 1 mm. Although the interval exceeds 0 mm as a matter of course, evaluation at finest possible intervals makes it possible to quantify a more correct configuration. At the present, the measurement is performed at intervals of about 0.05 mm.

Figure 4:
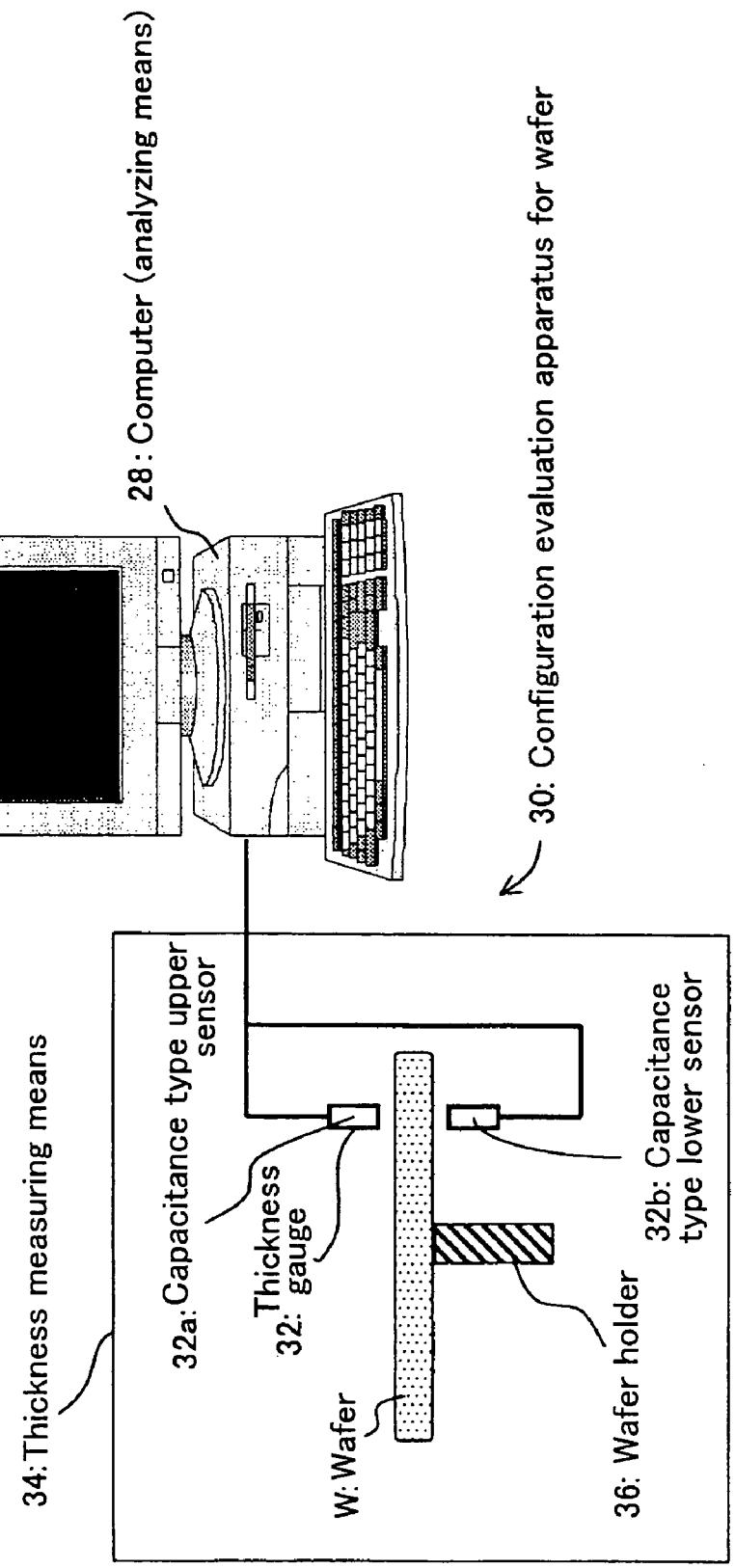
FIG. 4 is a schematic explanatory view showing an embodiment of an apparatus for evaluating a wafer configuration.

As described above, the wafer configuration is evaluated using a configuration evaluation apparatus 30 as shown in FIG. 4. The configuration evaluation apparatus 30 measures displacements on the wafer surface in a direction perpendicular to the front surface and the rear surface of the wafer W placed on a wafer holder in the wafer plane to show the measurement results as displacement data or thickness data. In addition to the evaluation method using the evaluation apparatus, there are available evaluation methods, wherein displacement of the front surface and the rear surface of a wafer W placed on a test board without being adsorbed thereon in a direction perpendicular to the surface of the test board is measured on the wafer plane to show the measurement results as displacement data, or displacement of the front surface of a wafer placed on a test board with being adsorbed (ideally) thereon in a direction perpendicular to the front surface of the test board is measured on the wafer plane to show the measurement results as thickness data. In FIG. 4, reference numeral 28 designates a computer (an analyzing means); reference numeral 32, a thickness gauge; reference numeral 32a, a capacitance type upper sensor; reference numeral 32b, a capacitance type lower sensor; reference numeral 34, a thickness measuring means; and reference numeral 36, a wafer holder. Using these devices and methods, displacement data and thickness data (a configuration profile) of the front surface and/or the rear surface are obtained.

The configuration profile thus obtained is analyzed. In order to more accurately check the configuration of a wafer outer peripheral portion, a prescribed region on the wafer center side (extending from about 7 mm away from the wafer outer periphery to the wafer center side) was virtually flat, a part of this region was set as a reference zone (a reference value), and a change from the reference zone was checked. For example, in the example in FIG. 5, a reference (a reference zone) is set such that a region of between 7 mm and 10 mm away from the wafer outer periphery is constant, and a rate of a configuration change in the region of between 7 mm and 10 mm away from the outer periphery is controlled. In particular, a wafer having a configuration the change of which is 0.1 μm or less in the above region is preferably used.

As the configuration of the starting wafer, there is important a configuration in a bonded region after an SOI wafer is formed, and a region extending from the outer periphery by about 3 mm is an unbonded region. For this reason, measurement is preferably performed in the region extending from 3 mm away from the outer periphery toward the main surface side. In particular, when a judgment is made in a region of between about 3 mm and 10 mm away from the outer periphery, it can be inferred whether voids are easily generated or not. Even when the region is changed to some extent, inference can be made. However, when the region is narrowed, there decreases the width of a configuration change of the existing wafer having a high flatness level, and hence it is difficult to discriminate the configuration change from a measurement error or the like, thereby the measurement accuracy being deteriorated. Furthermore, when measurement is performed in a region larger than the above region, a large undulation component is picked up, and erroneous judgment may be performed. A portion in the vicinity of the outer periphery of the wafer, for example a region extending from about 2 mm away from the outer periphery toward the main surface side can also be set. However, the configuration sharply changes in this region, and the configuration change influences the unbonded region more than generation of voids. For this reason, it is preferable for the present invention to include the above region.

In this manner, in the present invention, a wafer in which a configuration change within a prescribed range is controlled to be a prescribed value or less is used as a starting wafer of an SOI wafer. In general, the wafer outer peripheral portion mainly sags (the outer peripheral portion is thin). However, depending on a method for manufacturing a mirror wafer, the outer peripheral portion may rise (the outer peripheral portion is thick). The above configuration change value is obtained as an absolute value.

As another evaluation (sorting) method, in order to check a sharp configuration change in the wafer outer peripheral portion, a configuration profile is once differentiated, and the configuration change may be determined depending on the size of the slope (inclination) thereof. Configuration data of the wafer are measured at prescribed intervals on the wafer surface, the measured wafer configuration data are differentiated, and the obtained profile (the differentiated wafer configuration data) is analyzed. The wafer configuration measured as described above is not directly used, and the differentiated wafer configuration is analyzed, so that the configuration of the wafer outer peripheral portion can be accurately evaluated. In particular, a point of the local configuration change and the size of the inclination can be accurately evaluated.

Figure 6:
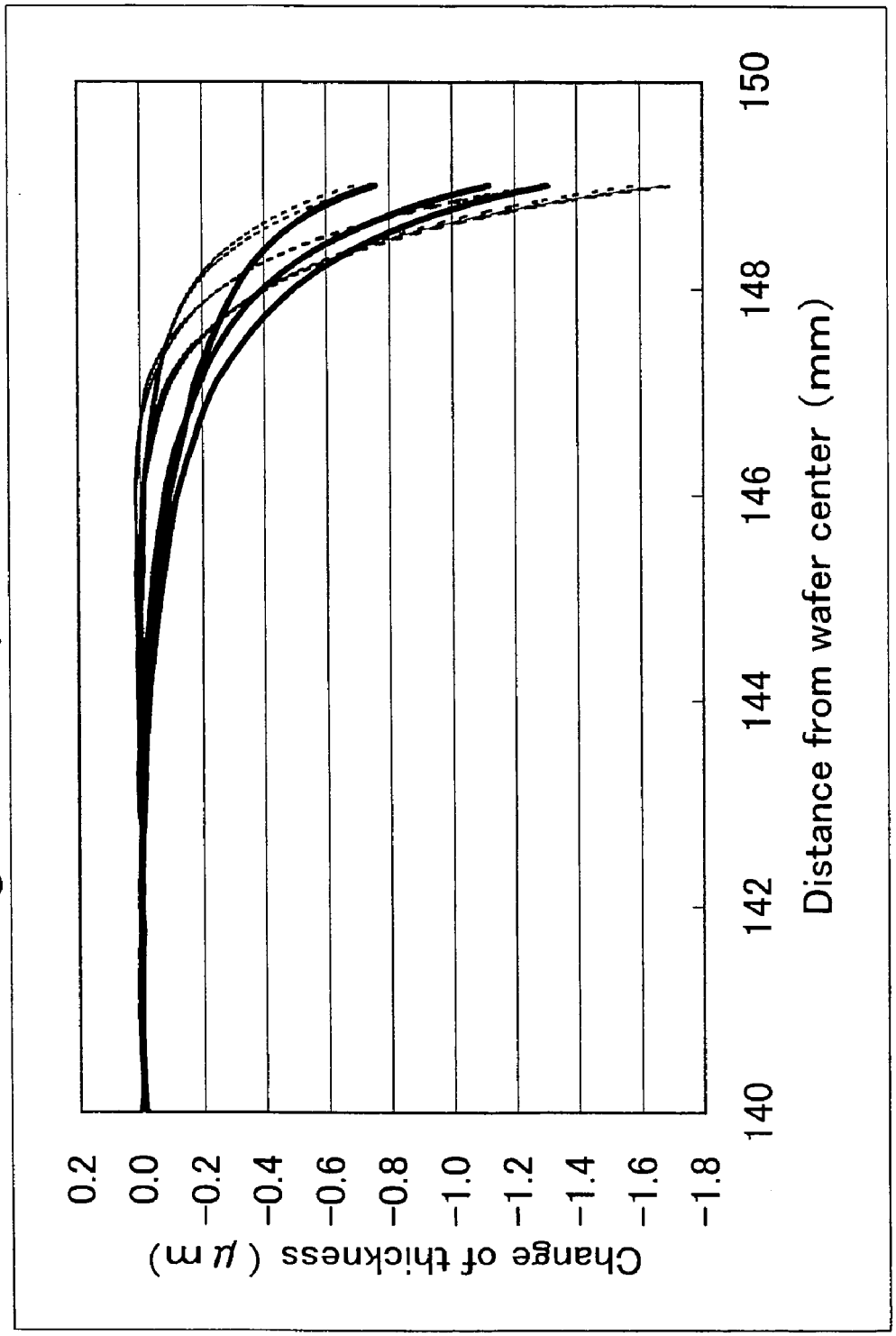
FIG. 6 is a graph showing an example of a configuration profile (a thickness change) at the outer peripheral portion of a wafer.

The method of the present invention will be described in further detail. For example, when a configuration (a thickness in this example) of a region ranging from the outer periphery of a wafer having a diameter of 300 mm to 10 mm away from the outer periphery is evaluated, a configuration as shown in FIG. 6 is obtained (a region ranging from the outer periphery to 1 mm away from the outer periphery is excluded). Differences of these configuration profiles are calculated at prescribed intervals, and data are plotted on the middle points of the calculated values to form a differential profile. This process is preferably performed at intervals of about 500 μm to 1 mm.

Figure 7:
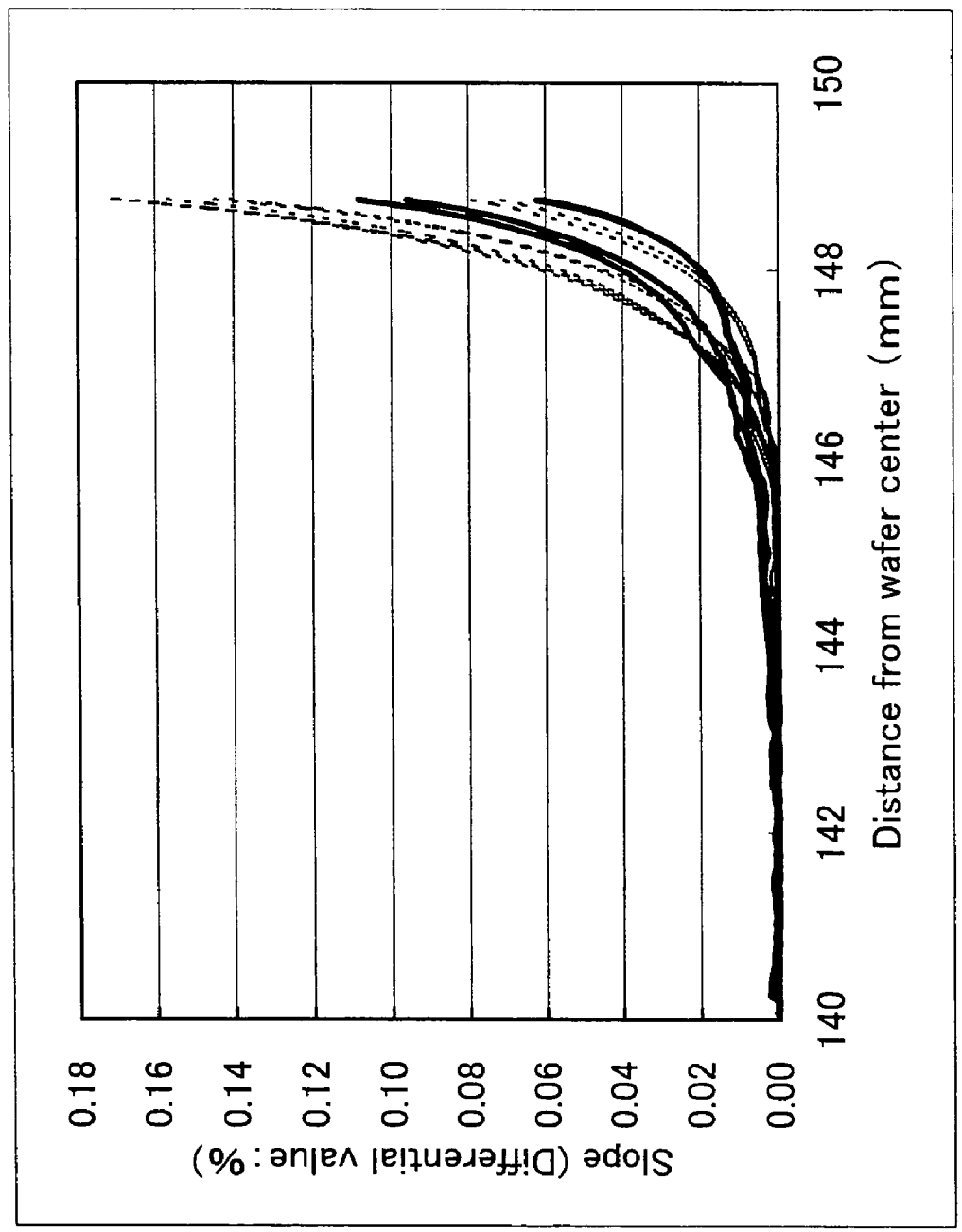
FIG. 7 is a graph showing a differential profile obtained by differentiating the configuration profile in FIG. 6.
Figure 8:
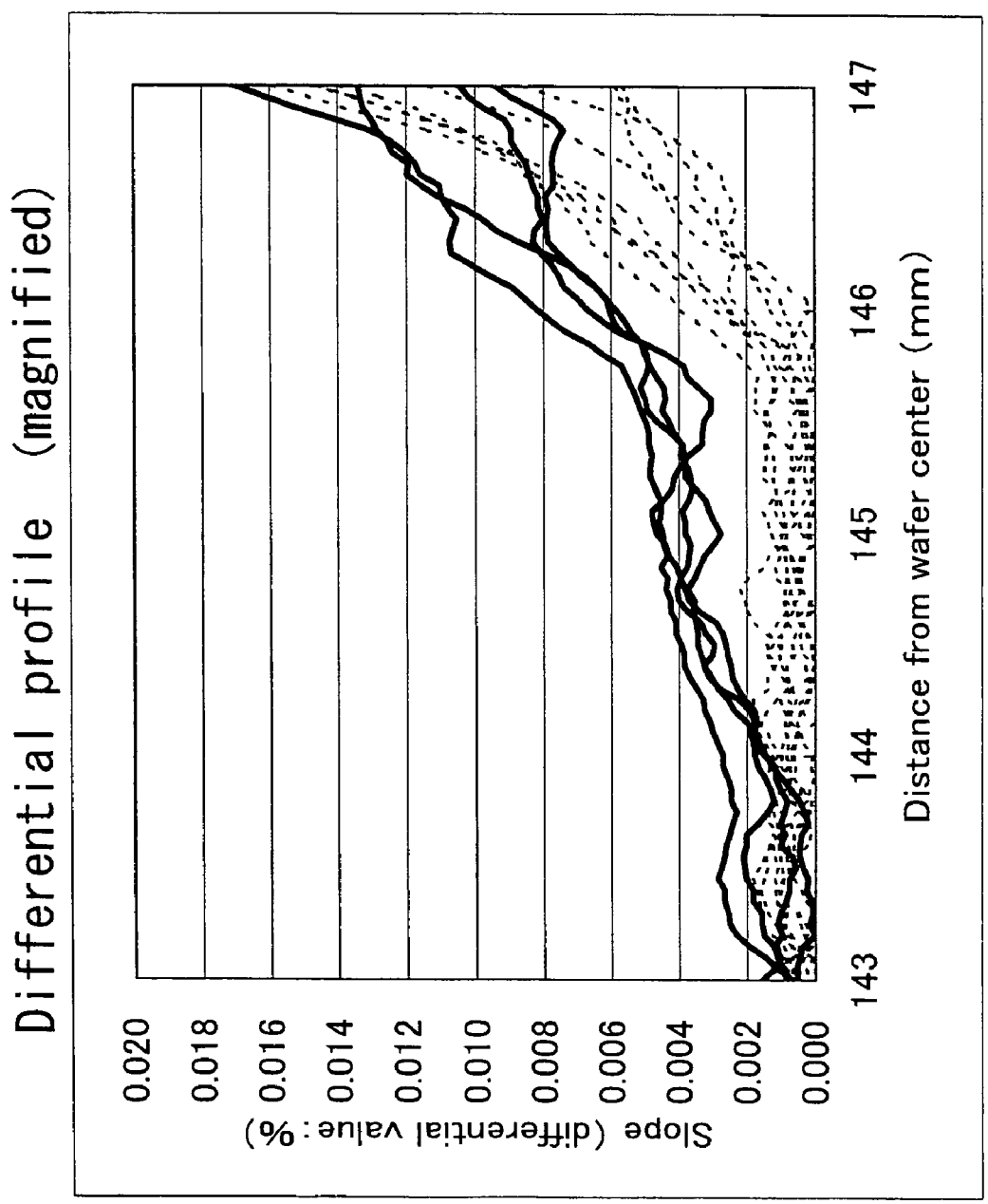
FIG. 8 is an enlarged graph of FIG. 7.

More specifically, of the thickness data, a value obtained by dividing a difference between No. (i+1) of the thickness data (yi+1) and No. (i) of the thickness data (yi) immediately before the data (yi+1) by the prescribed measurement interval (xi+1−xi) is calculated as a differential value (dyi), and the data is plotted on the middle point of (xi+1−xi). For example, the configuration profile in FIG. 6 is differentiated and then changed into a differential profile as shown in FIGS. 7 and 8. In these figures, magnitude of the thickness displacement is checked at intervals of 500 μm, a slope is expressed in percentage. For example, when the thickness changes by 0.01 μm per 500 μm, 0.01/500×100=0.002% is given.

When the wafer configuration is evaluated as described above, it has been found that a configuration sharply changes in a wafer in which voids are easily generated (and at a portion where voids are easily generated). In FIGS. 6 to 8, a solid line indicates a wafer in which voids are easily generated, and a dotted line indicates a wafer in which voids are less generated. In particular, as shown in the enlarged diagram in FIG. 8, in a wafer in which voids are generated, an inclination is about 0.004% at a position of 5 mm away from the wafer outer periphery. This position is not limited to a specific position. However, voids are easily generated in the outer peripheral portion of a wafer using, as a starting wafer, a wafer in which a configuration change at the above level occurs in a region ranging from 4 mm away from the outer periphery toward the inside. Such a wafer in which a configuration change is controlled as described above is used to manufacture an SOI wafer. Wafers may be manufactured in advance in the wafer processing step so as to have the above configuration, or wafers may be sorted through evaluation. In order to form the above configuration, in general, a polishing head is devised, or the hardness of a polishing cloth, a polishing pressure, and the like are controlled, so that a wafer having the configuration can be manufactured.

(Formation of BOX Oxide Film)

An SOI wafer is manufactured using the wafers thus prepared. Manufacturing conditions or the like of an SOI wafer are not limited to specific conditions. As an example, a method for manufacturing an SOI wafer using an ion-implantation delamination method will be described below together with the flow chart in FIG. 14. In manufacturing of an SOI wafer, an oxide film 54a that will become a buried oxide film 54 (an insulating layer) at a later stage is formed on the surface (the entire surface) of a bond wafer 52a (FIG. 14(b), step 102). As the oxide film 54a, a silicon oxide film is formed by thermal oxidation. Incidentally, an oxide film may not be formed on the bond wafer 52a (a wafer into which ions are implanted), and an oxide film may be formed on a base wafer 56a.

(Ion-Implantation)

Next, hydrogen ions are implanted into the bond wafer 52a to form a fine air bubble layer 58 (sealed layer) (FIG. 14(c), step 104).

(Cleaning)

Then, RCA cleaning or SPM cleaning to remove organic matter is performed (step 105).

(Adhering)

The bond wafer 52a in which the fine air bubble layer 58 (sealed layer) is formed is brought into close contact with the base wafer 56a through the oxide film 54a on the ion-implanted surface of the bond wafer 52a at room temperature (FIG. 14(d), step 106).

(Delamination)

Further, by applying heat treatment (delaminating heat treatment) at a temperature of 500° C. or higher, a part of the bond wafer 52a is delaminated at the sealed layer 58 and the rest of the bond wafer 52a stands in the form of a thin film (FIG. 14(e), step 108). Next, by applying bonding heat treatment (FIG. 14(f), step 110), the bond wafer 52a in the form of the thin film and the base wafer 56a are strongly bonded with each other through the oxide film 54a interposed therebetween, whereby a wafer 50 having an SOI structure is manufactured.

The SOI wafer manufactured using the adhering method has, at this stage, a sectional configuration of a structure in which the insulating film (layer) 54 and the SOI layer 52 are separately and sequentially laminated on one main surface of a support substrate 56. Regions called polishing sags are present in the outer peripheral portion of each of the two mirror-polished wafer surfaces to be adhered, and the regions are removed because bonding thereof becomes insufficient; therefore, the insulating layer 54 and the SOI layer 52 are generally smaller in diameter than the support substrate 56 by a value of the order of several mm, in general, about 3 mm.

Furthermore, the surface of the SOI layer of the wafer having the SOI structure may be modified, and the thickness of the SOI layer may be controlled (FIG. 14(g), step 112). For example, since damage caused by hydrogen ion implantation remains on the surface (the delaminating plane) of the SOI layer 52 of the SOI wafer 50 having the SOI structure, the damage layer is removed by applying polishing with a small polishing stock removal usually called touch polishing. In place of the touch polishing, by performing heat treatment in an argon gas atmosphere, sacrifice oxidation treatment in which thermal oxidation and removal of an oxide film are performed to reduce the film thickness of the SOI layer 52, or a combination thereof in a proper way, an SOI wafer 50 having a damage free thin film SOI layer 52 may be manufactured.

EXAMPLES

While further concrete description will be given of the present invention, showing examples below, it is needless to say that the examples are presented by way of illustration and should not be construed by way of limitation.

Experimental Example 1

At first, using, as starting wafers (base wafers and bond wafers), p-type mirror-polished silicon wafers each having a diameter of 300 mm, a <100> orientation and a resistivity of 10 Ω•cm manufactured from an ingot grown by a CZ method, there were prepared wafers of plural levels that were mirror-polished under different wafer manufacturing conditions. The outer peripheral portions of these wafers have slightly different from each other in configuration. The peripheral configurations of the wafers of these levels were measured using a wafer configuration evaluation apparatus (Nanometro (tradename) manufactured by Kuroda Precision Industries Ltd.).

Figure 5:
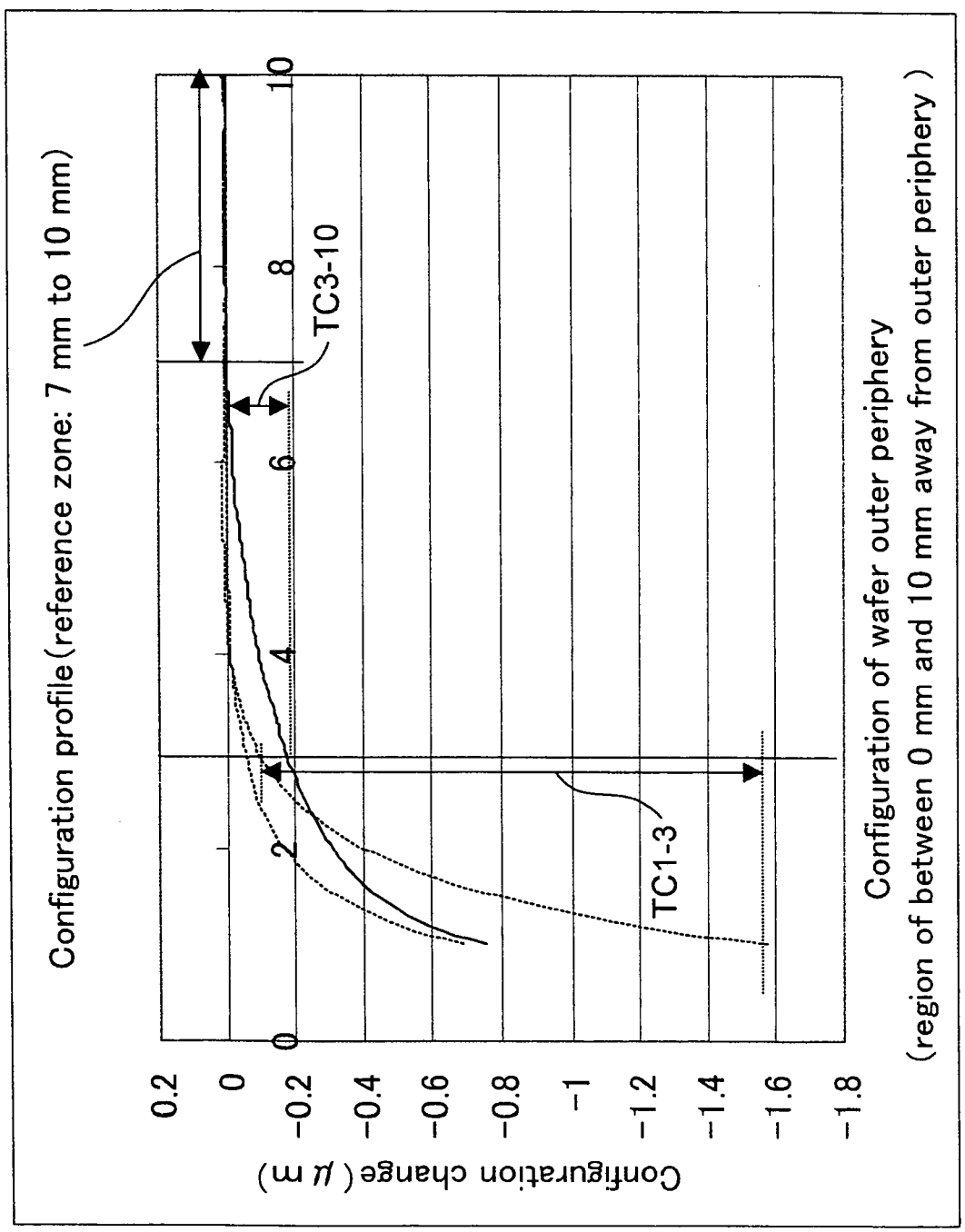
FIG. 5 is a graph showing an example of a configuration change at an outer peripheral portion of a wafer obtained in Experimental Example 1.

Measurement results of the configurations of the obtained wafers were compensated such that a region of between 7 mm and 10 mm away from the wafer outer periphery was set as a reference (zero) and plotted. At this time, an example of the obtained configuration profile is shown in FIG. 5.

In this experimental example, a configuration change in the region of between 10 mm and 3 mm away from the wafer outer periphery was checked (expressed numerically). The obtained value will be called TC3-10 hereinafter. Similarly, a configuration change in a region of between 3 mm and 1 mm away from the wafer outer periphery is indicated by TC1-3.

Oxide films each having a film thickness of 150 nm were then formed on the surfaces of the bond wafers on the respective levels through thermal oxidation. In addition, hydrogen ions were implanted to form a sealed layer. SPM cleaning and RCA cleaning were then performed to remove organic matter.

Next, the ion-implanted surface of the bond wafer was brought into close contact with the surface of the base wafer of the same level as that of the bond wafer at room temperature. Delaminating heat treatment was applied thereto at 500° C. for 30 minutes in a nitrogen atmosphere to delaminate a part of the bond wafer to thereby make the bond wafer into a thin film, with the result that there was obtained an SOI layer having a thickness of about 250 nm.

Thereafter, bonding heat treatment was applied thereto at 1100° C. for 2 hours in a nitrogen atmosphere to strongly bond the SOI layer to the base wafer. As a result, there was manufactured a wafer having an SOI structure.

Voids of the obtained SOI wafers were checked. A considerably large number of voids were generated in some wafers. In particular, a large number of voids were generated in vicinity of a position of 5 mm away from the wafer outer peripheries.

Figure 9:
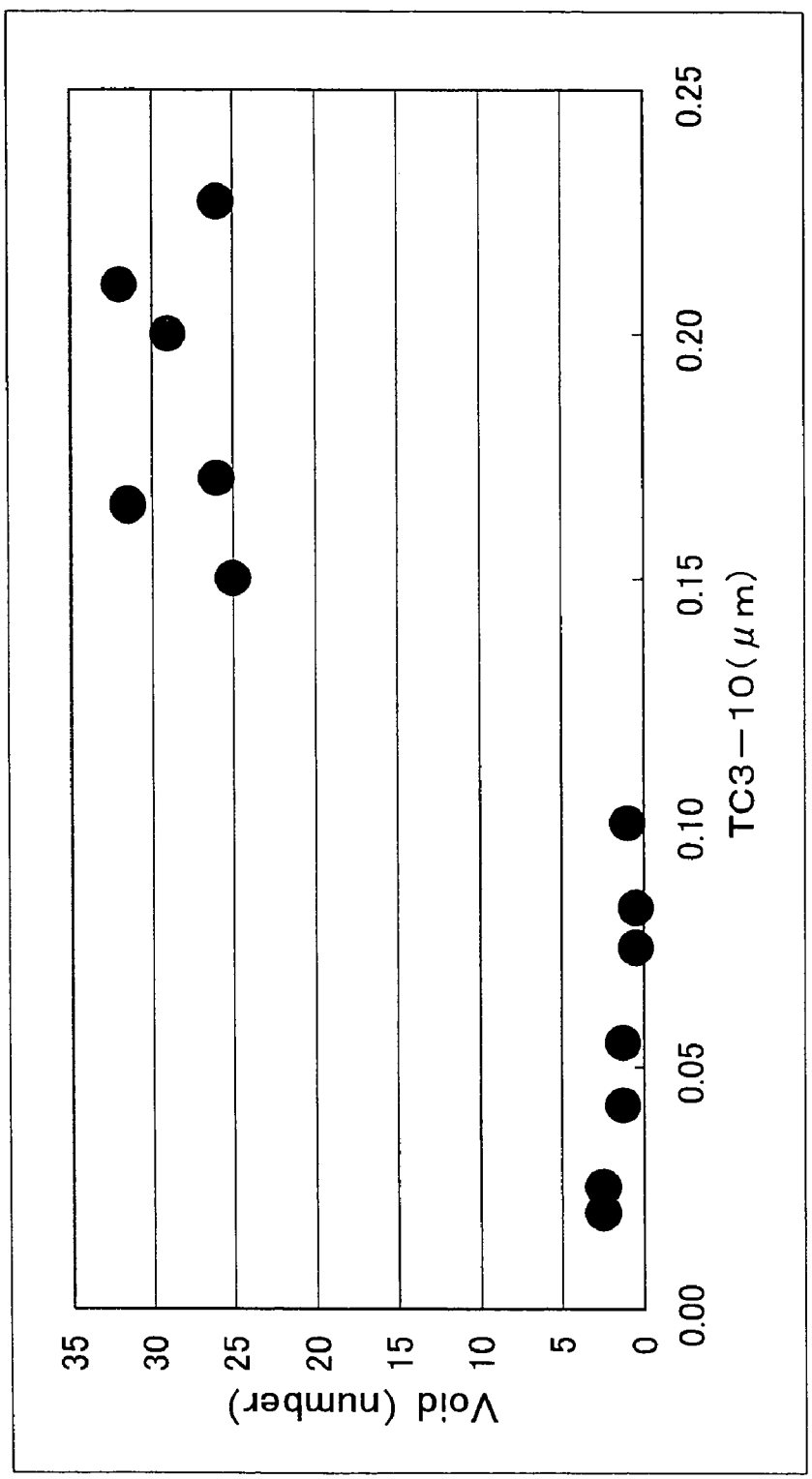
FIG. 9 is a graph showing a relationship between a generation status of voids and TC-10 in Experimental Example 1.

A relationship between a generation status of voids and (TC3-10) was plotted as shown in FIG. 9. When (TC3-10)=0.1 μm or less, the number of generated voids remarkably decreased. On the other hand, when (TC3-10) was 0.15 μm or more, a large number of voids were generated.

Incidentally, as is apparent from the configuration profiles as shown in FIG. 6, for example, there are some wafers where although a region of TC1-3 is small (the outer peripheral sag is small), voids are conspicuously generated.

Figure 10:
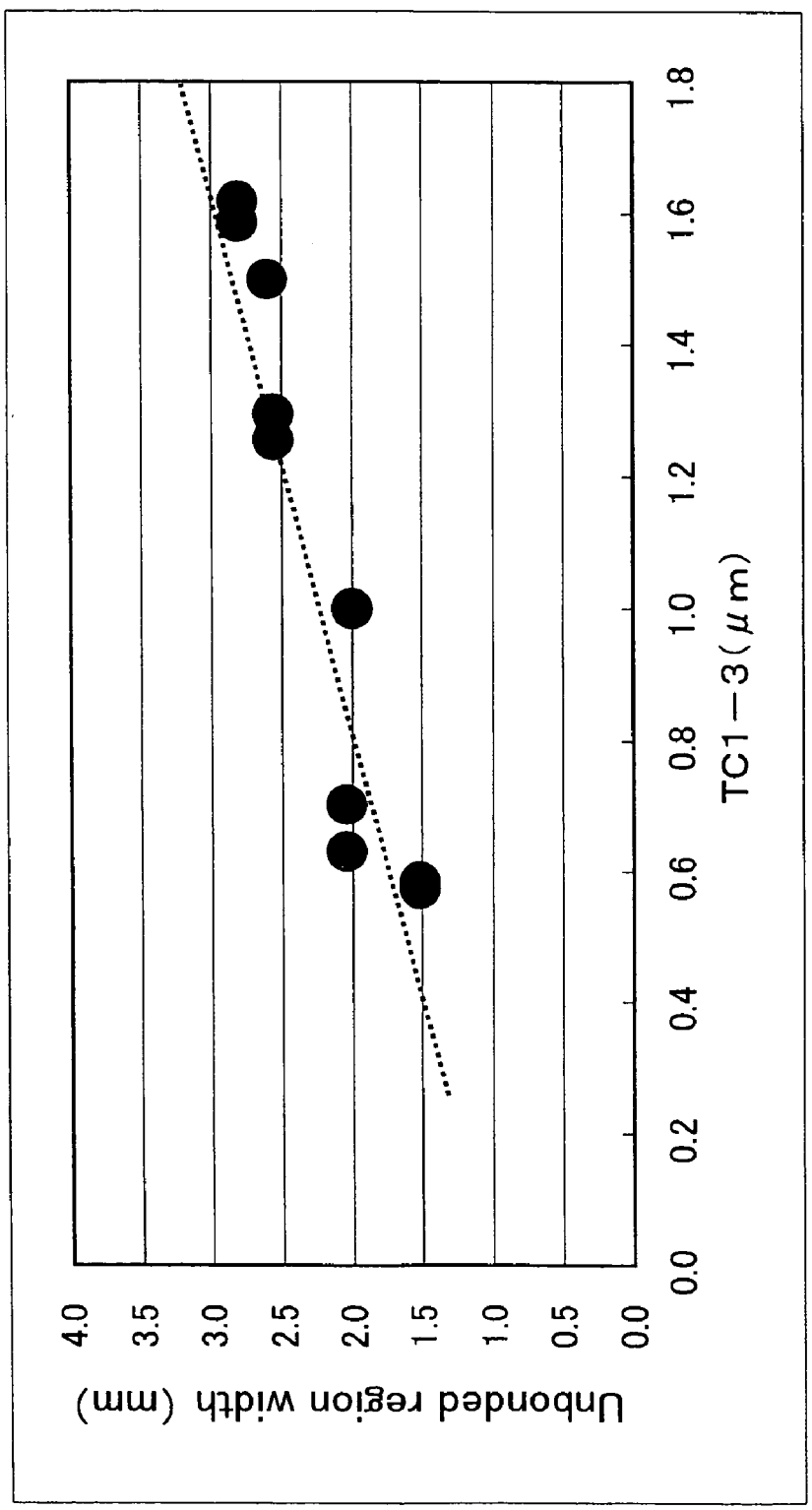
FIG. 10 is a graph showing a relationship between TC 1-3 and the width of an unbonded region in Experimental Example 1.

For reference, a relationship between TC1-3 and the width of the unbonded region is shown in FIG. 10. It is understood that an SOI layer (a terrace portion) is formed to the outer peripheral portion of the substrate as this value becomes smaller. It is understood that the unbonded region between the substrate and the SOI layer (insulating layer) affects a configuration change of the outermost peripheral portion (about 1 to 3 mm). On the other hand, it is understood that the configuration ranging from 3 mm away from the outer periphery to the center of the wafer affects a region in which voids are generated. That is, it has been found that in order to reduce voids, the configuration of a specific area in the outer peripheral sag, e.g., a region of between about 3 mm and 10 mm away from the outer periphery was especially a key element.

Experimental Example 2

As another method for evaluating a configuration, an obtained result (a configuration profile) was subjected to a differential process to determine an inclination. SOI wafers were manufactured by the same method as that in Experimental Example 1 using, as starting wafers, wafers polished in a plurality of polishing steps, and differential profiles and generation statuses of voids were checked. As a result, a slope in a wafer where a considerably large number of voids are generated is larger than that in a wafer where a small number of voids are generated as shown in FIG. 8, for example, at a position of 5 mm away from the outer periphery. In FIG. 8, a thick line indicates a wafer where voids are easily generated, and a dotted line indicates a wafer where voids were less generated. Also, a position where an inclination is generated starts from the inside of a wafer.

Figure 11:
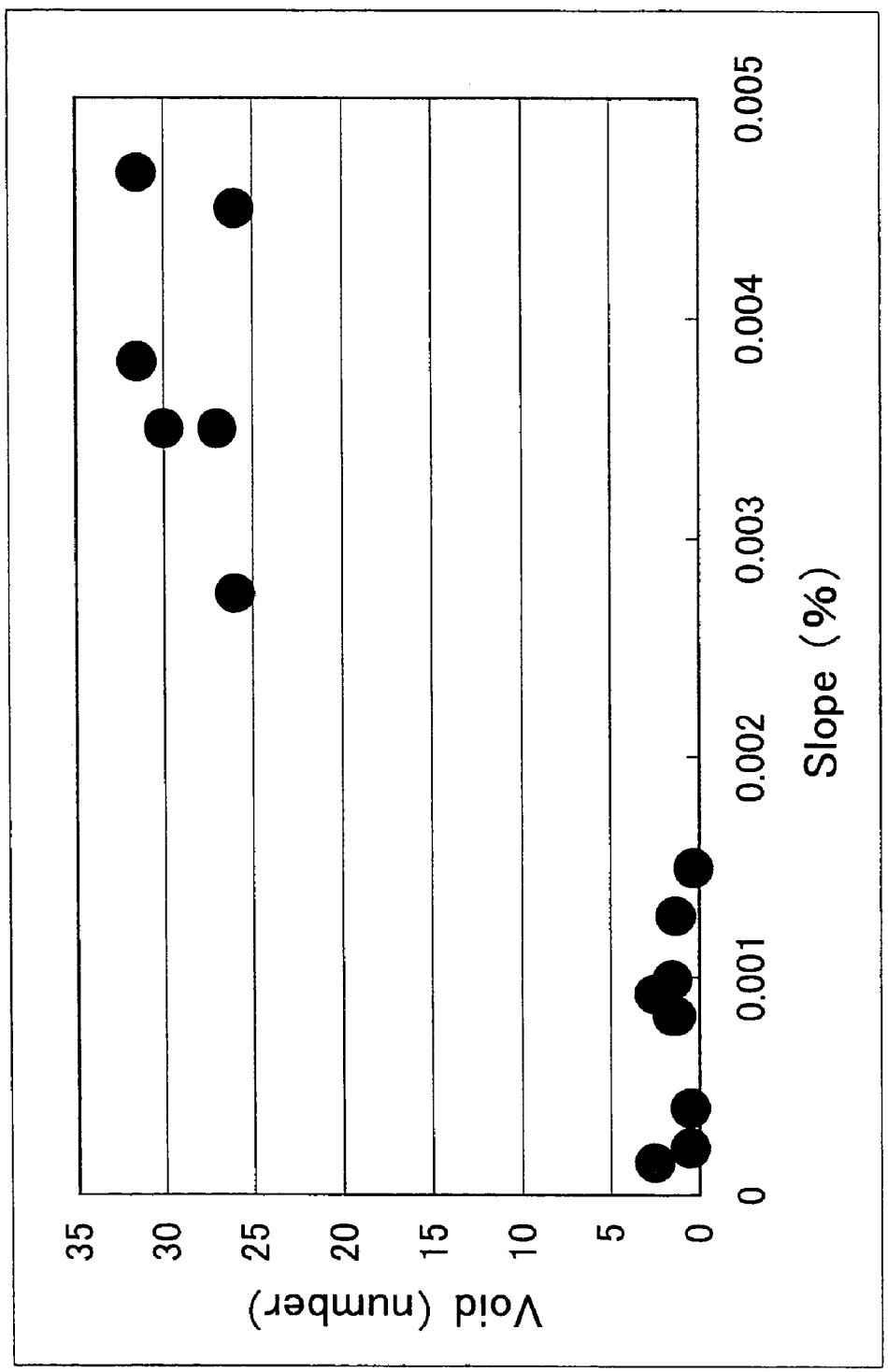
FIG. 11 is a graph showing a relationship between a slope and the number of voids at a position away from the wafer outer periphery by 5 mm (away from the center by 145 mm) in Experimental Example 2.

In this Experimental Example, especially, slope values and generation rates of voids at a position of 5 mm away from the wafer outer periphery (a position 145 mm away from the center) were checked. When a relationship between these values was plotted, a result as shown in FIG. 11 was obtained. When a configuration change was about 0.01 μm per 500 μm (or a configuration change was about 0.02 μm per 1 mm, and a slope was 0.002% per 1 mm), the number of generated voids could be remarkably reduced. When the configuration change was 0.01 μm or more, the number of generated voids increased. More specifically, it is confirmed that a large number of voids are generated when a sharp configuration change exists.

Example 1

Using, as starting wafers (base wafers and bond wafers), p-type mirror-polished silicon wafers each having a diameter of 300 mm, a <100> orientation, a resistivity of 10 Ω·cm manufactured from an ingot by a CZ method, and (TC3-10)=0.05 μm (a slope in a region of between 4.5 mm and 5.5 mm away from the outer periphery is 0.001%), SOI wafers were manufactured. A silicon oxide film of 150 nm in thickness was formed on the surface (the entire surface) of the bond wafer by thermal oxidation. Hydrogen ions were implanted into the bond wafer to form a fine air bubble layer (a sealed layer). In addition, RCA cleaning and SPM cleaning to remove organic matter were performed. Next, the oxide film on the surface of the bond wafer through which ions were implanted and the surface of the base wafer were brought into close contact with each other at room temperature.

Then, heat treatment (delaminating heat treatment) was applied thereto at 500° C. or higher to delaminate a part of the bond wafer from the sealed layer thereof to thereby make the bond wafer into a thin film, with result that there was obtained an SOI layer. Thereafter, bonding heat treatment was applied thereto to strongly bond the SOI layer to the base wafer. As a result, there was manufactured a wafer having an SOI structure. Furthermore, in order to reduce the surface roughness and strain of the SOI layer, heat treatment was applied in an argon gas atmosphere. This heat treatment was performed at 1200° C. for 1 hour in an argon gas atmosphere using a vertical heater type heat treatment apparatus (batch furnace). In this manner, there were improved to some extent damage caused by the ion implantation and surface roughness of the SOI layer. Furthermore, in order to improve the quality of the surface of the SOI layer, the SOI layer was polished by a CMP polishing apparatus. The SOI layer was subjected to sacrifice oxidation to oxidize silicon in the SOI layer. The resultant SOI layer was treated with hydrofluoric acid to finally manufacture a thin-film SOI wafer including an SOI layer of about 150 nm.

Figure 12:
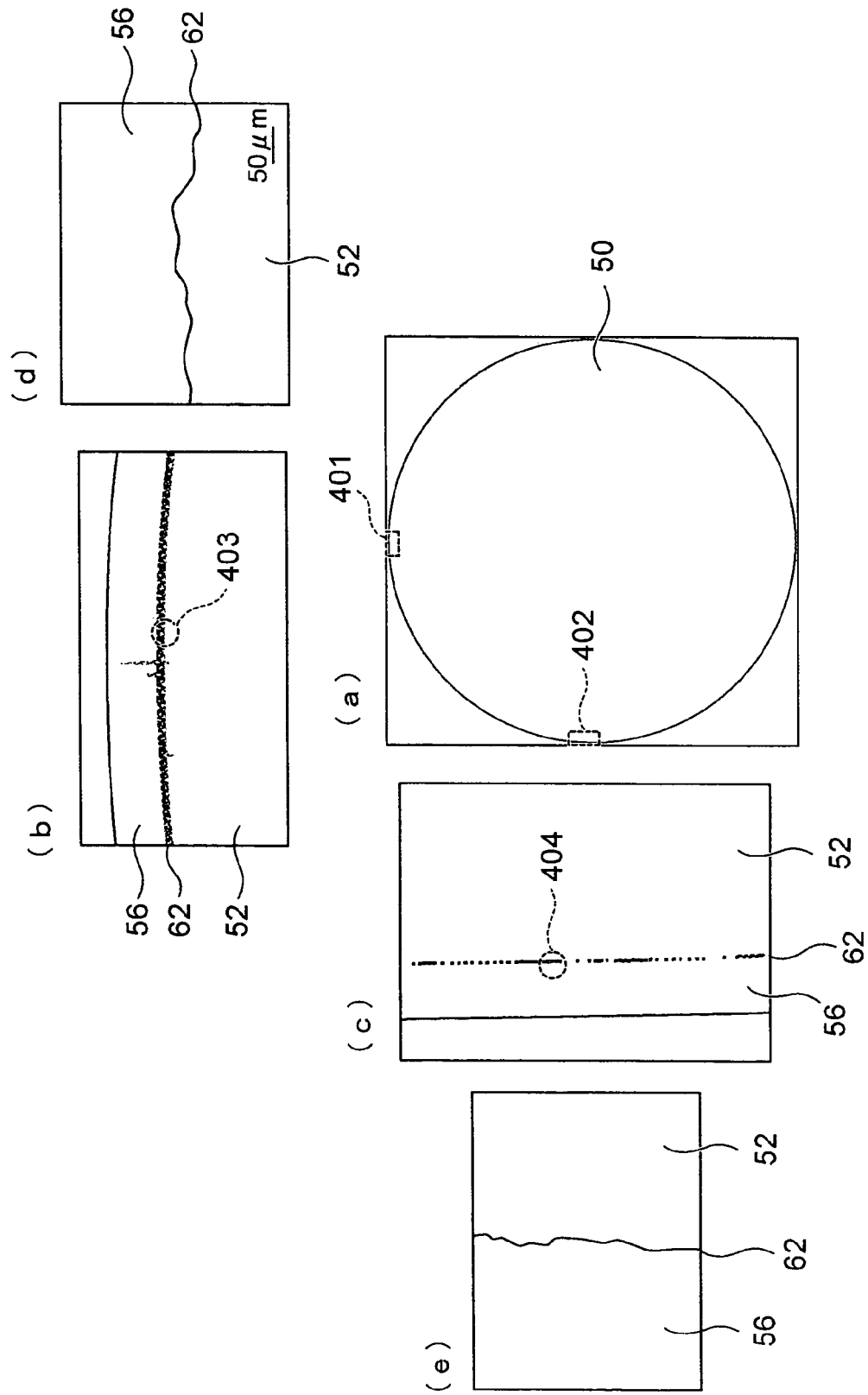
FIG. 12, consisting of FIGS. 12(*a*) to 12(*e*), is a schematic view showing results obtained by observing the outer peripheral portion of the SOI wafer of Example 1 using a laser microscope with a confocal optical system, wherein the part (*a*) shows an 501 wafer, the part (*b*) is an enlarged view of a portion 401 in the part (*a*), the part (*c*) is an enlarged view of a portion 402 in the part (*a*), the part (*d*) is an enlarged view of a portion 403 in the part (*b*), and the part (*e*), is an enlarged view of a portion 404 in the part (*c*).
Figure 13:
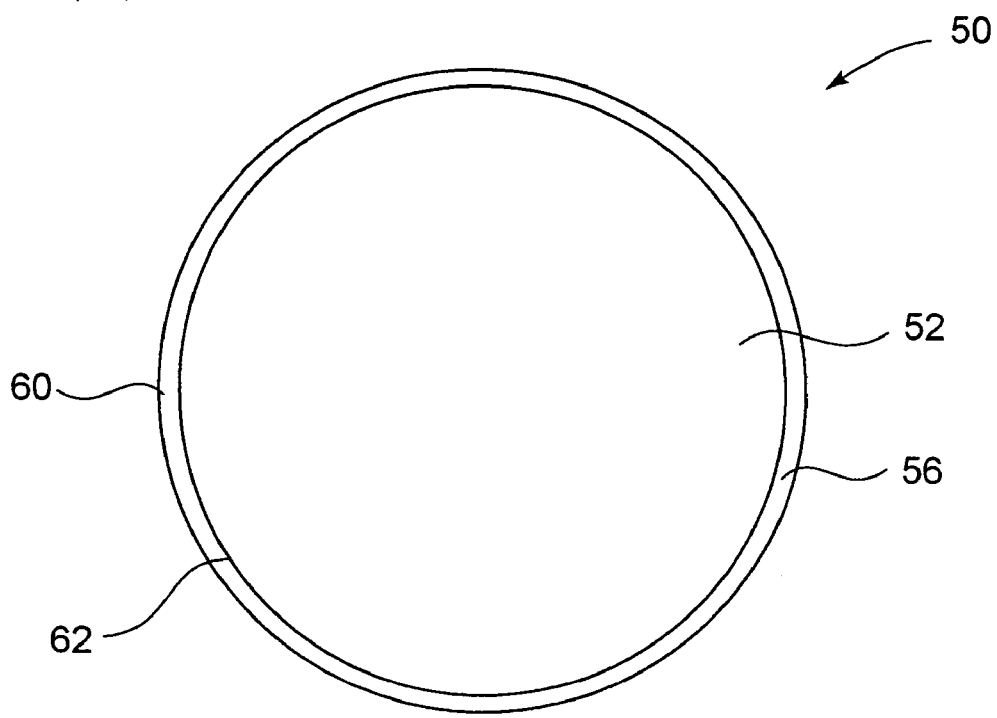
FIG. 13, consisting of FIGS. 13(*a*) and 13(*b*) is an explanatory view showing an example of the structure of an SOI wafer, wherein the part (*a*) is an explanatory plan view and the part (*b*) is an explanatory sectional view.
Figure 13:
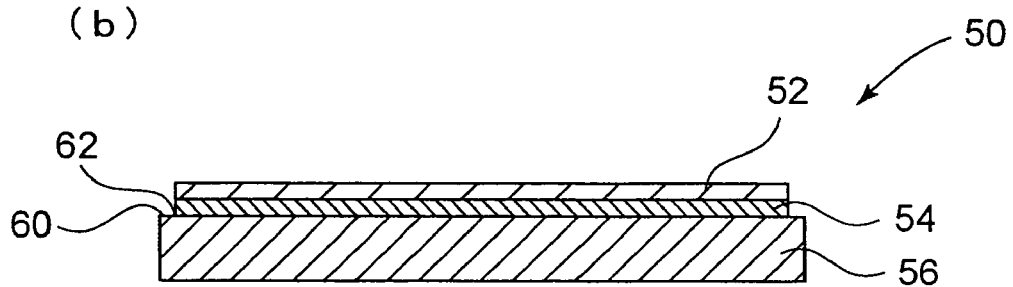

Twenty SOI wafers were manufactured by the above method. In most of the wafers, as shown in FIG. 12, no void was generated in wafer outer peripheral portions. FIG. 12 shows results obtained by observing the outer peripheral portion of the SOI wafer manufactured in this example using a laser microscope with a confocal optical system. In this drawing, there was particularly observed in a magnified state a boundary (terrace portion) 62 between the SOI layer 52 and the support substrate 56 of the SOI wafer 50. In the conventional SOI wafer 50 shown in FIG. 15, voids 70 were observed in a portion away from the SOI layer 52 by a predetermined distance. However, in the wafers of this example, voids were rarely observed. Although voids were observed in wafer outer peripheral portions of four wafers, the numbers of voids were very small, i.e., 5 or less.

Comparative Example 1

Figure 15:
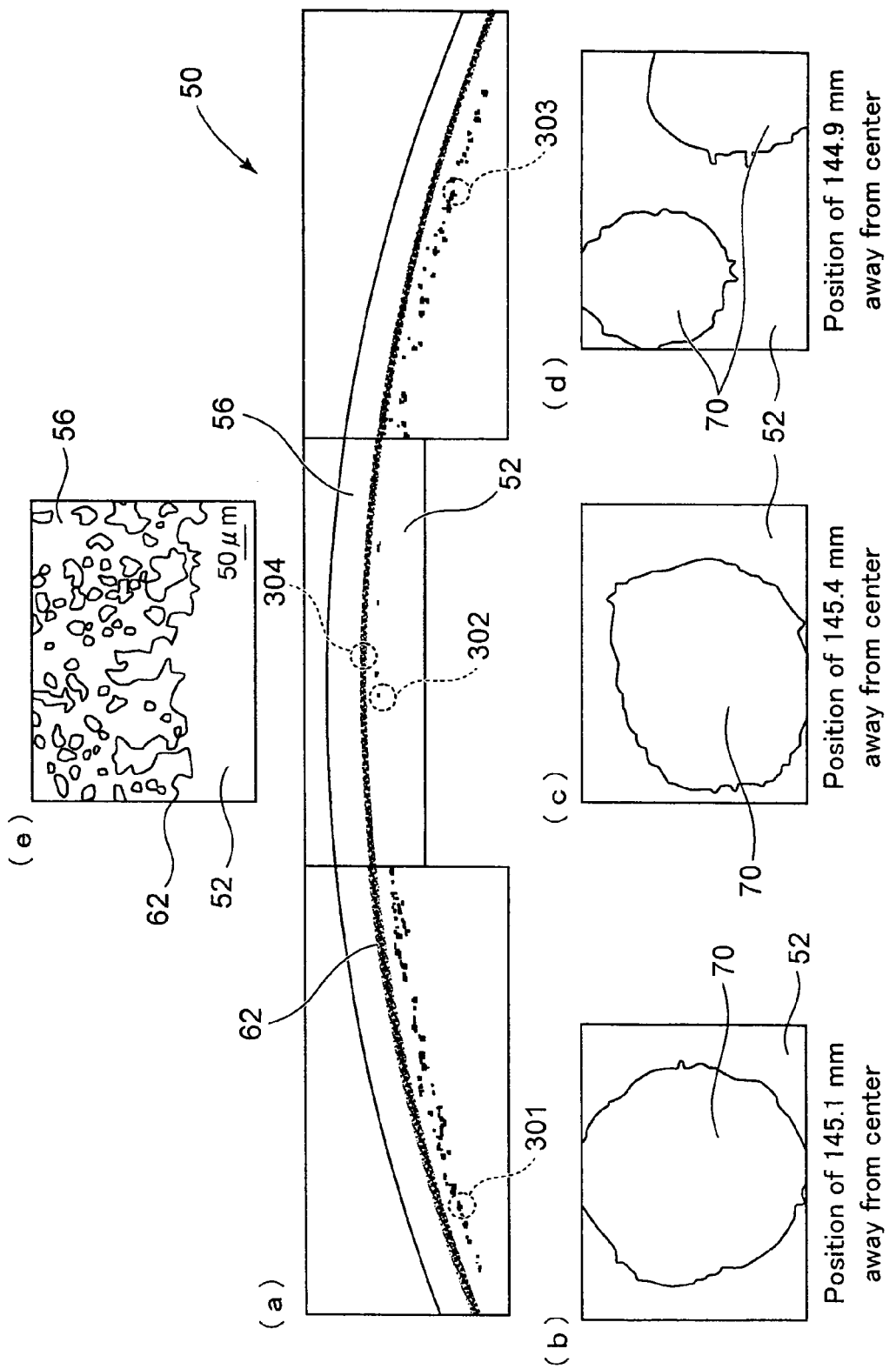
FIG. 15, consisting of FIGS. 15(*a*) to 15(*e*), is a schematic view showing results obtained by observing the outer peripheral portion of a conventional SOI wafer of Comparative Example 1 using a laser microscope with a confocal optical system, wherein the part (*a*) is an enlarged view of the peripheral portion of an SOI wafer, the part (*b*) is an enlarged view of a portion 301 in the part (*a*), the part (*c*) is an enlarged view of a portion 302 in the part (*a*), the part (*d*) is an enlarged view of a portion 303 in the part (*a*), and the part (*e*) is an enlarged view of a portion 304 in the part (*a*).

Using, as starting wafers, wafers each having (TC3-10)=0.18 μm (slope in a region extending from the outer periphery by 4.5 mm to 5.5 mm: 0.0045%), SOI wafers were manufactured by the same method as in Example 1. Twenty SOI wafers were manufactured by the above method. FIG. 15 shows results obtained by observing the outer peripheral portion of the SOI wafer manufactured in this comparative example using a laser microscope with a confocal optical system. In this drawing, there was particularly observed in a magnified state a boundary (terrace portion) 62 between the SOI layer 52 and the support substrate 56 of the SOI wafer 50. Voids 70 were observed in a portion away from the SOI layer 52 by a predetermined distance, e.g., a wafer outer peripheral portion (a position of about 5 mm away from the outer periphery, FIG. 15(b): a position of 145.1 mm away from the center, FIG. 15(c): a position of 145.4 mm away from the center, FIG. 15(d): and a position 144.9 mm away from the center). In many wafers, the numbers of voids were 20 or more, and voids were densely observed at positions opposing notches.

As apparent from the above description, with respect to generation of voids in the wafer outer peripheral portion, mere sags or the like of an outer peripheral configuration are not so important, and the configuration of the specific region is especially effective.

The present invention is not limited to the above embodiments. The embodiments are presented by way of illustration only and any of modifications or alterations thereof are included in the technical scope of the present invention as far as those have substantially the same construction as the technical concept stated in the appended claims of the present invention and exert an action and effect similar to those of the present invention.

For example, the manufacturing processes described in the above examples are presented by way of illustration only. As far as the method for manufacturing an SOI wafer includes the ion-implantation step and the adhering step, the present invention may employ addition of various steps such as cleaning and heat treatment other than the above steps. As to the steps of controlling the thickness of an SOI layer of an SOI structure, the present invention may adopt proper changes of the steps depending on purposes, for example, a partial change for the order of the steps, and partial omission for the steps such as CMP polishing.

CAPABILITY OF EXPLOITATION IN INDUSTRY

As described above, according to the method for manufacturing an SOI wafer of the present invention, the number of voids generated in a wafer outer peripheral portion remarkably decreases, and it is possible to manufacture an SOI wafer with a good product yield and high productivity.

The invention claimed is:

1. A method for manufacturing an SOI wafer comprising the steps of:
    forming an insulating layer on at least one wafer of two starting wafers; and
    adhering the one wafer to the other wafer without an adhesive,
    wherein at least one starting wafer has a central point and extends radially outwardly from the central point to terminate in an outer periphery, the at least one starting wafer has a first surface and an opposite second surface defining a thickness therebetween, a variation in the thickness, viewed radially in cross-section, is 0.1 µm or less in a region of between 10 mm and 3 mm disposed radially inwardly from the outer periphery.

2. The method for manufacturing an SOI wafer according to claim 1, wherein the method comprises the steps of:
    implanting hydrogen ions or rare gas ions through an upper surface of the one wafer to form a micro-bubble layer in the interior of the one wafer; thereafter
    bringing the surface of the one wafer through which the ions have been implanted into close contact with the other wafer through the insulating layer interposed therebetween; then
    delaminating a part of the one wafer with the micro-bubble layer as a cleavage plane by applying heat treatment for the rest thereof to become a thin film; and
    bonding strongly the one wafer in the form of a thin film to the other wafer through the insulating layer interposed therebetween by applying further heat treatment.

3. A method for manufacturing an SOI wafer comprising the steps of:
    forming an insulating layer on at least one wafer of two starting wafers; and
    adhering the one wafer to the other wafer without an adhesive,
    wherein at least one starting wafer has a central point and extends radially outwardly from the central point to terminate in an outer periphery, the at least one starting wafer has a first surface and an opposite second surface defining a thickness therebetween and a variation in thickness in µm divided by an interval in µm over which the variation in thickness occurs multiplied by 100, is 0.002% or less at a position of at least 5 mm radially from the outer periphery.

4. The method for manufacturing an SOI wafer according to claim 3, wherein the method comprises the steps of:
    implanting hydrogen ions or rare gas ions through an upper surface of the one wafer to form a micro-bubble layer in the interior of the one wafer; thereafter
    bringing the surface of the one wafer through which the ions have been implanted into close contact with the other wafer through the insulating layer interposed therebetween; then
    delaminating a part of the one wafer with the micro-bubble layer as a cleavage plane by applying heat treatment for the rest thereof to become a thin film; and
    bonding strongly the one wafer in the form of a thin film to the other wafer through the insulating layer interposed therebetween by applying further heat treatment.

5. A method for manufacturing an SOI wafer comprising the steps of:
    forming an insulating layer on at least one wafer of two starting wafers; and
    adhering the one wafer to the other wafer without an adhesive,
    wherein at least one starting wafer has a central point and extends radially outwardly from the central point to terminate in an outer periphery, the at least one starting wafer has a first surface and an opposite second surface defining a thickness therebetween, a variation in the thickness, viewed radially in cross-section, is 0.1 µm or less in a region of between 10 mm and 3 mm disposed radially inwardly from the outer periphery and the variation in thickness in µm divided by an interval in µm over which the variation in thickness occurs multiplied by 100, is 0.002% or less at a position of at least 5 mm radially from the outer periphery.

6. The method for manufacturing an SOI wafer according to claim 5, wherein the method comprises the steps of:

implanting hydrogen ions or rare gas ions through an upper surface of the one wafer to form a micro-bubble layer in the interior of the one wafer; thereafter bringing the surface of the one wafer through which the ions have been implanted into close contact with the other wafer through the insulating layer interposed therebetween; then delaminating a part of the one wafer with the micro-bubble layer as a cleavage plane by applying heat treatment for the rest thereof to become a thin film; and bonding strongly the one wafer in the form of a thin film to the other wafer through the insulating layer interposed therebetween by applying further heat treatment.

* * * * *